United States Patent
Aonuma et al.

(10) Patent No.: US 9,490,444 B2
(45) Date of Patent: Nov. 8, 2016

(54) ORGANIC LIGHT-EMITTING ELEMENT WITH REGULATION INSULATING LAYER AND TWO-COMPONENT ELECTRON TRANSPORT LAYER AND METHOD OF MAKING

(75) Inventors: Masaki Aonuma, Fukuoka (JP); Hiroshi Katagiri, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/235,895

(22) PCT Filed: Apr. 11, 2012

(86) PCT No.: PCT/JP2012/002514
§ 371 (c)(1),
(2), (4) Date: Jan. 29, 2014

(87) PCT Pub. No.: WO2013/018251
PCT Pub. Date: Feb. 7, 2013

(65) Prior Publication Data
US 2014/0159031 A1    Jun. 12, 2014

(30) Foreign Application Priority Data
Aug. 3, 2011    (JP) .................... 2011-169700

(51) Int. Cl.
*H01L 51/50* (2006.01)
*H01L 51/56* (2006.01)
*H01L 51/00* (2006.01)

(52) U.S. Cl.
CPC ....... *H01L 51/5072* (2013.01); *H01L 51/5076* (2013.01); *H01L 51/5092* (2013.01); *H01L 51/56* (2013.01); *H01L 51/0081* (2013.01); *H01L 51/0083* (2013.01); *H01L 51/0086* (2013.01)

(58) Field of Classification Search
CPC .. H01L 51/5072; H01L 51/508; H01L 51/56
See application file for complete search history.

(56) References Cited

U.S. PATENT DOCUMENTS

| | | | | |
|---|---|---|---|---|
| 5,443,922 A | * | 8/1995 | Nishizaki | ............... H05B 33/14 313/503 |
| 5,922,480 A | * | 7/1999 | Nakamura | ............. C09K 11/06 313/504 |

(Continued)

FOREIGN PATENT DOCUMENTS

| CN | 1838846 | 9/2006 |
|---|---|---|
| JP | 5-163488 | 6/1993 |

(Continued)

OTHER PUBLICATIONS

Ke, L. "Magnesium fluoride modified interfaces for organic light-emitting diode" Thin Sol. Films 515 Dec. 21, 2006 pp. 3881-3886.*

(Continued)

*Primary Examiner* — Asok K Sarkar
*Assistant Examiner* — Grant Withers
(74) *Attorney, Agent, or Firm* — Greenblum & Bernstein, P.L.C.

(57) ABSTRACT

The present invention provides an organic light-emitting element with improved chemical stability at the interface between the light-emitting layer and the electron transport layer, which maintains excellent, stable luminous efficiency for a long period. For this purpose, one aspect of the present invention is an organic EL element having a substrate, and a hole injection layer, a buffer layer, a light-emitting layer, a regulation layer, an electron transport layer and a cathode which are sequentially layered on one side of the substrate. The regulation layer is made of NaF, which is not chemically reactive with the light-emitting layer or the electron transport layer, and the electron transport layer is made of a CT complex using a host material and an n-type dopant, which are both organic materials.

38 Claims, 5 Drawing Sheets

(56) References Cited

U.S. PATENT DOCUMENTS

| | | | | |
|---|---|---|---|---|
| 6,483,236 | B1* | 11/2002 | Hung | H01L 51/5012 313/504 |
| 7,279,704 | B2* | 10/2007 | Walters | C09K 11/06 257/40 |
| 2002/0057051 | A1* | 5/2002 | Kobayashi | H01L 51/0005 313/504 |
| 2002/0061420 | A1 | 5/2002 | Sohn et al. | |
| 2002/0121860 | A1* | 9/2002 | Seo | H01L 51/5012 313/506 |
| 2003/0146443 | A1* | 8/2003 | Yamazaki | H01L 51/0059 257/80 |
| 2005/0098207 | A1 | 5/2005 | Matsumoto et al. | |
| 2005/0231100 | A1 | 10/2005 | Elliott et al. | |
| 2005/0253131 | A1 | 11/2005 | Kobayashi | |
| 2005/0264174 | A1* | 12/2005 | Liao | H01L 51/5278 313/500 |
| 2006/0147752 | A1 | 7/2006 | Lee et al. | |
| 2006/0199037 | A1* | 9/2006 | Morii | H01L 51/5012 428/690 |
| 2006/0240279 | A1* | 10/2006 | Adamovich | H01L 51/5016 428/690 |
| 2007/0020484 | A1* | 1/2007 | Kim | H01L 51/5072 428/690 |
| 2007/0228942 | A1 | 10/2007 | Akai et al. | |
| 2007/0231503 | A1* | 10/2007 | Hwang | C09K 11/06 428/1.1 |
| 2008/0006822 | A1* | 1/2008 | Ohsawa | H01L 51/5012 257/40 |
| 2009/0079337 | A1* | 3/2009 | Seo | H01L 51/50 313/504 |
| 2009/0085479 | A1* | 4/2009 | Ushikubo | H01L 51/5072 313/506 |
| 2009/0167159 | A1* | 7/2009 | Song | H01L 51/5088 313/504 |
| 2010/0207108 | A1* | 8/2010 | Herron | C07D 201/00 257/40 |
| 2011/0127513 | A1* | 6/2011 | Lee | C07D 401/04 257/40 |
| 2011/0156019 | A1* | 6/2011 | Tessler | B82Y 10/00 257/40 |
| 2011/0297925 | A1* | 12/2011 | Breuning | C09K 11/06 257/40 |
| 2012/0104369 | A1* | 5/2012 | Kawata | C07D 333/76 257/40 |
| 2012/0126220 | A1* | 5/2012 | Yokoyama | C07D 471/04 257/40 |
| 2012/0184738 | A1* | 7/2012 | Yersin | C07F 1/005 544/225 |
| 2013/0033173 | A1 | 2/2013 | Yamauchi | |
| 2013/0048956 | A1* | 2/2013 | Balaganesan | C07D 401/14 257/40 |
| 2013/0062599 | A1* | 3/2013 | Holmes | H01L 51/5008 257/40 |
| 2013/0075704 | A1* | 3/2013 | Takasu | C07D 241/38 257/40 |
| 2013/0112946 | A1* | 5/2013 | Park | C07D 471/06 257/40 |
| 2014/0183517 | A1* | 7/2014 | Huh | H01L 51/0061 257/40 |
| 2014/0203273 | A1* | 7/2014 | Kubota | H01L 51/5072 257/40 |

FOREIGN PATENT DOCUMENTS

| | | |
|---|---|---|
| JP | 2000-133458 | 5/2000 |
| JP | 2002-015873 | 1/2002 |
| JP | 2002-124381 | 4/2002 |
| JP | 2006-245329 | 9/2006 |
| JP | 2007-200776 | 8/2007 |
| JP | 2007-265792 | 10/2007 |
| JP | 2007-266587 | 10/2007 |
| JP | 2008-098475 | 4/2008 |
| JP | 2009-164578 | 7/2009 |
| WO | 2011/087058 | 7/2011 |

OTHER PUBLICATIONS

Tyagi, P. "Low Voltage organic light emitting diode using p-i-n. structure" Syn. Mat. vol. 160, iss. May 9-10, 2010 pp. 1126-1129.*

Ma, J. W. "Organic light-emitting diodes based on new n-doped electron transport layer" Syn. Met. vol. 158, iss. Dec. 21-24, 2008 pp. 810-814.*

"Lattice Energy" article from the chemistry department at Perdue available online at http://chemed.chem.purdue.edu/genchem/topicreview/bp/ch7/lattice.html as of Feb. 13, 2006.*

Xu, Wei "High-efficiency p-i-n organic light-emitting diodes with a novel n-doping electron transport layer" Current App. Phys. 9 Jul. 3, 2008 pp. 732-736.*

Shi, S. "Improved electron injection in organic light-emitting devices with a lithium acetylacetonate [Li(acac)]/aluminium bilayer cathode" Semicond. Sci Technol. 22 Jan. 30, 2007 pp. 249-252.*

Brown, T. M. "Efficient electron injection in blue-emitting polymer light-emitting diodes with LiF/Ca/Al cathodes" App. Phys. Lett. vol. 79, No. 2 Jun. 9, 2001 pp. 174-176.*

International Search Report (ISR) in International Patent Application No. PCT/JP2012/002514, dated Jul. 24, 2012.

Haskal et al., "Lithium-aluminum contacts for organic light-emitting devices", Applied Physics Letters 71, pp. 1151-1153 (1997).

Tamoto et al., "Electroluminescence of 1,3,4-Oxadiazole and Triphenylamine-Containing Molecules as an Emitter in Organic Multilayer Light emitting Diodes", Chem. Mater., 9, pp. 1077-1085 (1997).

Corey J. Bloom et al., "Low Work Function Reduced Metal Complexes as Cathodes in Organic Electroluminescent Devices", J. Phys. Chem. B 2003, 107, pp. 2933-2938 (Mar. 11, 2003).

Office Action from the Patent Office of the People's Republic of China (SIPO) in Chinese Patent Application No. 201280038350.6, dated Jul. 27, 2015, together with a partial English language translation.

Office Action from Taiwan Intellectual Property Office (TIPO) in Taiwanese Patent Appl. No. 101116182, dated Apr. 22, 2016, along with a partial English language translation.

* cited by examiner

ORGANIC LIGHT-EMITTING ELEMENT WITH REGULATION INSULATING LAYER AND TWO-COMPONENT ELECTRON TRANSPORT LAYER AND METHOD OF MAKING

TECHNICAL FIELD

The present invention relates to an organic electric-field light-emitting element (referred to hereinafter as an "organic EL element"), which is an electric light emitter. Particularly, the present invention relates to a technology for stably driving such an organic EL element at low electricity while ensuring a wide range of luminous intensity from low luminous intensity to high luminous intensity for the use as a light source or the like.

BACKGROUND ART

In recent years, progress is being made in research and development of diverse functional elements which involve the use of an organic semiconductor.

Organic EL elements are known as being one of the most common among such functional elements. An organic EL element is a current-driven light-emitting element, and commonly has a pair of electrodes, namely a pixel electrode and a common electrode, and for example a hole injection transport layer, a light-emitting layer and an electron injection transport layer, layered between the pair of electrodes.

When driving the organic EL element, voltage is applied between a pair of electrodes. The emission of light from the organic EL element is caused by an electric-field light-emitting phenomenon taking place as a result of the transition to the ground state of excitons generated by the recombination of holes, which are injected from the anode to the hole injection transport layer, and electrons, which are injected from the cathode to the electron injection transport layer. Now more attention is being given to the application of organic EL elements as a light emitter or a light source for various display devices. This owes to the advantageous characteristics of the organic EL element, which include: high visibility resulting from self-luminescence; and excellent shock resistance resulting from the fully solid-state structure thereof.

Organic EL elements can be largely divided into two types, according to the material used for forming the light-emitting layer therein. The first type of organic EL elements is a vapor deposition type. In a vapor deposition-type organic EL element, mainly organic low molecular material is formed as a film by applying a vacuum process such as a vapor deposition method. The second type of organic EL elements is an application type. In an application-type organic EL element, mainly either organic high molecular material, or organic low molecular material having excellent thin film forming properties is formed as a film by applying a wet process such as an inkjet method and a gravure printing method.

When comparing the two types of organic EL elements, vapor deposition-type organic EL elements have gained more popularity up to this point, for reasons such as higher light-emitting efficiency of the light-emitting material and longer operating lifetime in comparison with application-type organic EL elements (for instance, refer to Patent Literatures 1 and 2). As a result, vapor deposition-type organic EL elements have already been put into practical use in mobile phone displays, small-sized TVs and the like.

At the same time, much effort is also being made in research and development of technology for enhancing the light-emitting efficiency of organic EL elements. Efficient injection of carriers (holes and electrons) from the electrodes to the functional layer is essential in causing an organic EL element to emit light with high efficiency, high luminous intensity, and low electrical consumption. For the efficient injection of carriers, it is effective to provide the hole injection transport layer and the electron injection transport layer, and reduce the energy barrier (injection barrier) between each electrode and the light-emitting layer.

Considering the above, the electron injection transport layer is commonly made of an alkaline-earth metal such as Ba.

CITATION LIST

Patent Literature

[Patent Literature 1] Japanese Patent Application Publication No. 2007-200776
[Patent Literature 2] Japanese Patent Application Publication No. 2008-98475

Non-Patent Literature

[Non-Patent Literature 1] Applied Physics Letters 71, 1151 (1997)
[Non-Patent Literature 2] Chem. Mater. 9 1077 (1997)

SUMMARY OF INVENTION

Technical Problem

Conventional organic light-emitting elements need improvement in terms of prevention of chemical reaction between the light-emitting layer and the electron transport layer, prevention of environmental changes at the interface between the light-emitting layer and the electron transport layer, and maintenance of stable device properties.

Also desired is maintaining excellent luminous efficiency by providing an electron transport layer with high chemical stability.

The present invention is made in view of the needs described above. The first aim thereof is to provide an organic light-emitting element capable of maintaining stable device properties by preventing chemical reaction between the light-emitting layer and the electron transport layer, and environmental changes at the interface between the light-emitting layer and the electron transport layer. The second aim is to provide an organic light emitting element with excellent luminous efficiency by providing an electron transport layer with high chemical stability.

Solution to Problem

To solve the problem above, one aspect of the present invention provides an organic light-emitting element comprising: an anode; a cathode disposed opposite the anode; an organic light-emitting layer disposed between the anode and the cathode, and containing an organic light-emitting material; an electron transport layer disposed between the organic light-emitting layer and the cathode, and transporting electrons injected from the cathode to the organic light-emitting layer; and a regulation layer disposed between and in contact with the organic light-emitting layer and the electron transport layer, and regulating transfer of constituent molecules of the organic light-emitting layer and of the electron transport layer while allowing transfer of electrons therebetween, wherein the electron transport layer is made of an organic substance, and the regulation layer is not chemically reactive with the electron transport layer or the organic light-emitting layer.

Advantageous Effects of Invention

According to the organic EL element pertaining to one aspect of the present invention, the regulation layer is formed between the organic light-emitting layer and the electron transport layer. The regulation layer is not chemically reactive with the electron transport layer or the organic light emitting layer. Therefore, when excitons are generated in the organic light-emitting layer or radicals are generated in the organic light emitting layer and the electron transport layer during the driving, the constituent molecules of the layers are prevented from causing unnecessary chemical reactions that lead to changes and deteriorations in their properties. Thus, the regulation layer isolates the electron transport layer and the organic light-emitting layer from each other in a desirable manner. Therefore, the stated feature maintains the stable element structure for a long time, and achieves excellent light-emitting properties.

DESCRIPTION OF EMBODIMENTS

Aspects of the Invention

Figure 1:
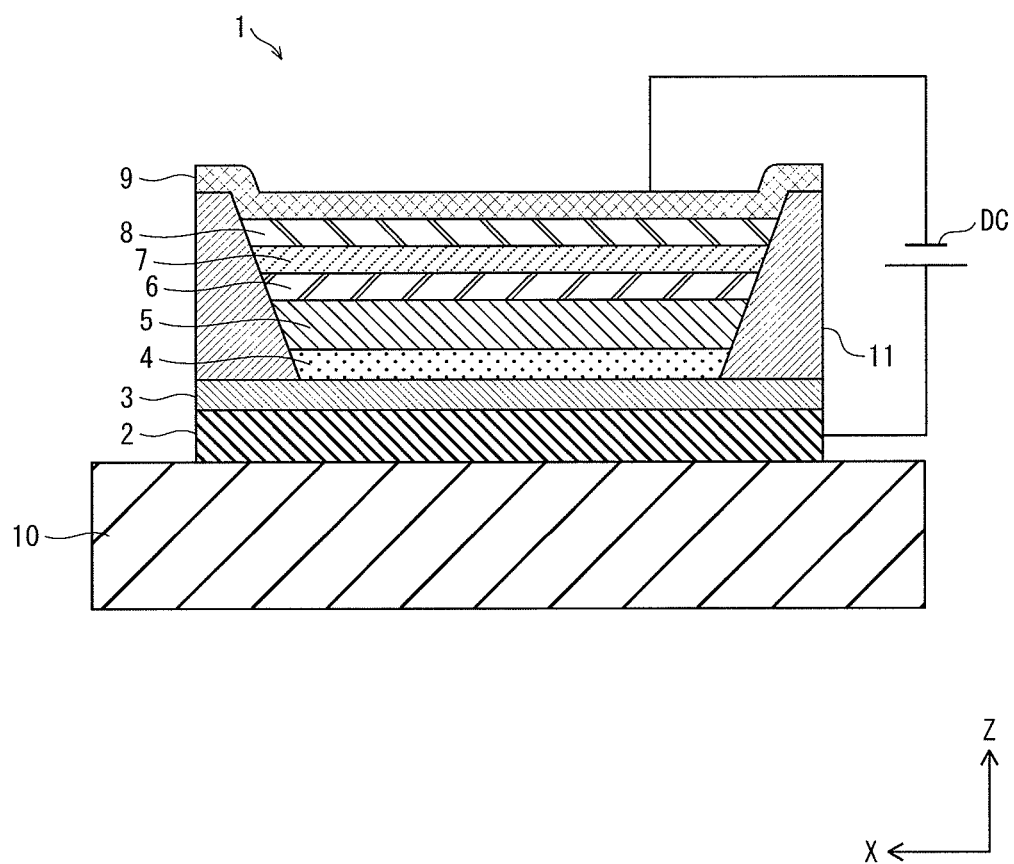
FIG. 1 is a schematic cross-sectional view illustrating a structure of an organic EL element pertaining to Embodiment 1.

An organic light-emitting element pertaining to one aspect of the present invention is an organic light-emitting element comprising: an anode; a cathode disposed opposite the anode; an organic light-emitting layer disposed between the anode and the cathode, and containing an organic light-emitting material; an electron transport layer disposed between the organic light-emitting layer and the cathode, and transporting electrons injected from the cathode to the organic light-emitting layer; and a regulation layer disposed between and in contact with the organic light-emitting layer and the electron transport layer, and regulating transfer of constituent molecules of the organic light-emitting layer and of the electron transport layer while allowing transfer of electrons therebetween, wherein the electron transport layer is made of an organic substance, and the regulation layer is not chemically reactive with the electron transport layer or the organic light-emitting layer.

Optionally, the electron transport layer may contain: a first organic substance that is capable of transporting electrons; and a second organic substance that is of n-type and is different from the first organic substance.

Optionally, the regulation layer may be made of a chemical compound including: a first material; and a second material that is different from the first material, and lattice energy of the chemical compound may be greater than binding energy between any atoms of the constituent molecules of the organic light-emitting layer and of the electron transport layer.

Optionally, the regulation layer may be an insulative layer.

Optionally, the regulation layer may have a thickness no less than 1 nm and no more than 10 nm.

Optionally, a difference in energy level between a highest occupied molecular orbital of the first organic substance and a lowest unoccupied molecular orbital of the second organic substance may be no more than 1.6 eV.

Optionally, the electron transport layer may contain a charge-transfer complex (CT complex) of the first organic substance and the second organic substance.

Optionally, the regulation layer may be made of either one or both of an alkali metal fluoride and an alkaline-earth metal fluoride.

Optionally, the alkali metal fluoride may be NaF.

Optionally, the alkaline-earth metal fluoride may be $MgF_2$.

Optionally, the electron transport layer may contain: BPhen, $Alq_3$ or BCP, as the first organic substance; and $Ru(terpy)_2$, $Cr(bpy)_3$, $Cr(TMB)_3$, PyB or $CoCp_2$, as the second organic substance.

An organic light-emitting element pertaining to another aspect of the present invention is an organic light-emitting element comprising: an anode; a cathode disposed opposite the anode; an organic layer disposed between the anode and the cathode, and containing an organic substance; a chemical compound layer disposed between the organic layer and the cathode; and a regulation layer disposed between and in contact with the organic layer and the chemical compound layer, and regulating transfer of constituent molecules of the organic layer and of the chemical compound layer while allowing transfer of electrons therebetween, wherein the chemical compound layer is made of an organic substance, and the regulation layer is not chemically reactive with the organic layer or the chemical compound layer.

Optionally, the chemical compound layer may contain: a first organic substance; and a second organic substance that is different from the first organic substance.

Optionally, the regulation layer may be made of a chemical compound including: a first material; and a second material that is different from the first material, and lattice energy of the chemical compound may be greater than binding energy between any atoms of the constituent molecules of the organic layer and of the chemical compound layer.

Optionally, the regulation layer may be an insulative layer.

Optionally, the regulation layer may have a thickness no less than 1 nm and no more than 10 nm.

Optionally, a difference in energy level between a highest occupied molecular orbital of the first organic substance and a lowest unoccupied molecular orbital of the second organic substance may be no more than 1.6 eV.

Optionally, the chemical compound layer may contain a CT complex of the first organic substance and the second organic substance.

Optionally, the regulation layer may be made of either one or both of an alkali metal fluoride and an alkaline-earth metal fluoride.

Optionally, the alkali metal fluoride may be NaF.

Optionally, the alkaline-earth metal fluoride may be $MgF_2$.

Optionally, the chemical compound layer may contain: BPhen, $Alq_3$ or BCP, as the first organic substance; and $Ru(terpy)_2$, $Cr(bpy)_3$, $Cr(TMB)_3$, PyB or $CoCp_2$, as the second organic substance.

An organic light-emitting element pertaining to another aspect of the present invention is an organic light-emitting element comprising: an anode; a cathode disposed opposite the anode; an organic light-emitting layer disposed between the anode and the cathode, and containing an organic substance; an insulative layer disposed in contact with the organic light-emitting layer; and an electron transport layer disposed in contact with the insulative layer and containing: a first organic substance; and a second organic substance that is different from the first organic substance.

With the stated structure, the insulation layer isolates the organic light-emitting layer and the electron transport layer from each other, and the constituents of the organic light-emitting layer and the electron transport layer are prevented from being mixed with each other. On the other hand, the capability of transporting electrons toward the organic light-emitting layer is maintained at a desirable level by forming the electron transport layer from a CT complex using a first organic substance and a second organic substance and thereby improving the electron injection properties.

Optionally, the insulative layer may contain a chemical compound including: a first material; and a second material that is different from the first material, and lattice energy of the chemical compound may be greater than binding energy between any constituent atoms of the organic substance contained in the organic light-emitting layer, and greater than binding energy between any constituent atoms of the first organic substance and the second organic substance contained in the electron transport layer.

The insulation layer may be insulative over time, or the chemical compound may be prevented from dissociation and remain in the state of the compound. Here, "insulative over time" means that the insulation layer maintains the insulation properties from the manufacturing of the element irrespective of the lapse of time.

Optionally, the insulative layer may have a thickness no less than 1 nm and no more than 10 nm.

Optionally, a difference in energy level between a highest occupied molecular orbital of the first organic substance and a lowest unoccupied molecular orbital of the second organic substance may be no less than 0 eV and no more than 1.6 eV.

Optionally, the electron transport layer may contain a CT complex of the first organic substance; and the second organic substance.

Optionally, the insulative layer may be made of either one or both of an alkali metal fluoride and an alkaline-earth metal fluoride.

Optionally, the electron transport layer may contain: BPhen, $Alq_3$ or BCP, as the first organic substance; and $Ru(terpy)_2$, $Cr(bpy)_3$, $Cr(TMB)_3$, PyB or $CoCp_2$, as the second organic substance.

An organic light-emitting element pertaining to another aspect of the present invention is an organic light-emitting element comprising: an anode; a cathode disposed opposite the anode; an organic layer disposed between the anode and the cathode and containing an organic substance; an insulative layer disposed in contact with the organic layer; and a chemical compound layer disposed in contact with the insulative layer and containing: a first organic substance; and a second organic substance that is different from the first organic substance.

Optionally, the insulative layer may contain a chemical compound including: a first material; and a second material that is different from the first material, and lattice energy of the chemical compound may be greater than binding energy between any constituent atoms of the organic substance contained in the organic layer, and greater than binding energy between any constituent atoms of the first organic substance and the second organic substance contained in the chemical compound layer.

The insulation layer may be insulative over time, or the chemical compound may be prevented from dissociation and remain in the state of the compound. Here, "insulative over time" means that the insulation layer maintains the insulation properties from the manufacturing of the element irrespective of the lapse of time.

Optionally, the insulative layer may have a thickness no less than 1 nm and no more than 10 nm.

The first organic substance of the compound layer may have electron injection properties, and the second organic substance of the compound layer may be of n-type.

Another aspect of the present invention is an organic light-emitting device including any of the above-described organic light-emitting elements pertaining to the present invention.

A method of manufacturing an organic light-emitting element pertaining to another aspect of the present invention is a method of manufacturing an organic light-emitting element, comprising: a first step of forming an organic light-emitting layer above an anode, the organic light-emitting layer containing an organic light-emitting material; a second step of forming a regulation layer in contact with the organic light-emitting layer; a third step of forming an electron transport layer in contact with the regulation layer; and a fourth step of forming a cathode above the electron transport layer, wherein in the second step, the regulation layer is formed to be not chemically reactive with the electron transport layer or the organic light-emitting layer, and in the third step, the electron transport layer is formed to contain: a first organic substance that is capable of transporting electrons; and a second organic substance that is of n-type and is different from the first organic substance.

A method of manufacturing an organic light-emitting element pertaining to another aspect of the present invention is a method of manufacturing an organic light-emitting element, comprising: a first step of forming an organic layer above an anode, the organic layer containing an organic material; a second step of forming a regulation layer in contact with the organic layer; a third step of forming a chemical compound layer in contact with the regulation layer; and a fourth step of forming a cathode above the chemical compound layer, wherein in the second step, the regulation layer is formed to be not chemically reactive with the chemical compound layer and the organic layer, and in the third step, the chemical compound layer is formed to contain: a first organic substance that is capable of transporting electrons; and a second organic substance that is of n-type and is different from the first organic substance.

Embodiments and practical examples of the present invention are described below. However, the present invention is not limited to those, and may be modified within the technical scope of the present invention.

Conventional Problems and Aspects of the Present Invention

Conventional organic EL elements have following specific problems.

Figure 4:
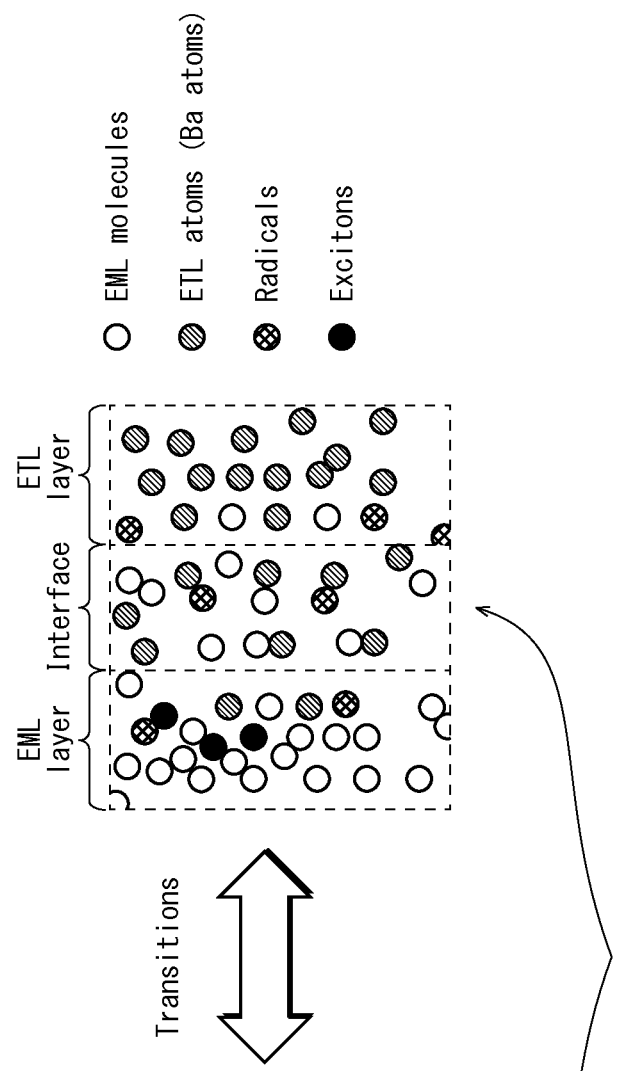
FIGS. 4(a) and (b) are schematic diagrams showing an area around the interface between a light-emitting layer and an electron transport layer pertaining to a conventional technology, before and after driving.

FIG. 4 is a schematic cross-sectional view showing the interface between the light-emitting layer (EML) and the electron transport layer (ETL) of a conventional organic EL element.

The first problem is that before the element drives (i.e. initial state) as schematically shown in Part (a) of FIG. 4, the interface between the light-emitting layer (EML) and the electron transport layer (ETL) contains both the organic molecules constituting the light-emitting layer and the molecules constituting the electron injection layer. When the element drives under this condition, excitons and radicals are generated by the recombination of the carriers in the light-emitting layer as shown in Part (b) of FIG. 4. Repeated transitions of the element between the driving state and the stopping state greatly change the environment in the interface. Such a change deteriorates the constituents of the light-emitting layer and the electron transport layer, and may bring a bad influence on the device properties (See Non-Patent Literature 1).

The second problem is the deterioration of the electron transport layer. The electron injection efficiency can be improved by forming the electron transport layer from an alkaline-earth metal such as Ba or an alkali metal, as shown in FIG. 4. However, since alkaline-earth metals and alkali metals have relatively high chemical reactivity, they may be changed to oxides or hydroxides by being brought into contact with oxygen or moisture during the process of manufacturing the element. This phenomenon changes the electron injection properties, and may deteriorate the properties of the organic EL element or shorten the lifespan.

The aspects of the present shown below are the results of earnest study of such problems conducted by the inventors, and they are characterized by having a regulation layer between the organic light-emitting layer and the electron transport layer. This regulation layer is not chemically reactive with the electron transport layer or the organic light emitting layer. Therefore, if excitons are generated in the organic light-emitting layer or radicals are generated in the organic light-emitting layer or in the electron transport layer during the driving, the molecules constituting these layers do not react with each other, and thus changes and deteriorations in the properties of the layers are prevented. The electron transport layer and the organic light emitting layer are thus isolated in a desirable manner. Therefore, the stated feature maintains the stable element structure for a long time, and achieves excellent light-emitting properties.

The following specifically describes embodiments of the present invention.

Embodiment 1

Structure of Organic EL Element 1

FIG. 1 is a schematic cross-sectional view illustrating the structure of an organic light-emitting element (an organic EL element 1) pertaining to Embodiment 1 of the present invention.

The organic EL element 1 is an application type element in which a light-emitting layer 5 is applied by a wet process. A hole injection layer 3, a buffer layer 4, the light-emitting layer 5, a regulation layer 6 and an electron transport layer 7 are sequentially layered between a pair of electrodes, namely an anode 2 and a cathode 8. On the upper surface of the cathode 8, a passivation layer 9 is formed for passivation. The anode 2 and the cathode 6 are connected to a direct current power supply DC to externally supply power to the organic EL element 1.

Substrate 10

The substrate 10 is the base material for the organic EL element 1 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

While not shown in the figures, TFTs (thin film transistors) are provided on the surface of the substrate 10 for driving the organic EL element 1.

Anode 2

The anode 2 is a 50 nm-thick thin transparent conductive film of ITO. However, the anode 2 is should not be limited in this way, and may be a transparent conductive film of IZO or the like, a metal film of aluminum or the like, or a metal alloy film of APC (alloy of silver, palladium and copper), ARA (alloy of silver, rubidium and gold), MoCr (alloy of molybdenum and chrome) or NiCr (alloy of nickel and chrome), for example. Furthermore, the anode 2 may have a layered structure composed of any of these films.

Hole Injection Layer 3

The hole-injection layer 3 is for efficiently injecting holes toward the light-emitting layer 5, and the material thereof is, for example, a molybdenum oxide or a molybdenum tungsten oxide, but not limited to them.

Banks 11

On the surface of the hole injection layer 3, banks 11 composed of insulative organic material (for instance, acrylic resins, polyimide resins, or novolac-type phenolic resins) are formed. The banks 11 are disposed such that each of the banks has a uniform trapezoidal cross-section, and such that the banks form either a line bank structure or a pixel bank structure on the surface of the hole injection layer 3. With this structure, the banks 11 define light-emitting regions in the top view of the substrate 10.

Note that the banks 11 are not essential for the present invention, and are used for providing a plurality of organic EL elements 1 on the substrate 10. The banks 11 are not necessary when the organic EL element 1 is used alone.

Buffer Layer 4

The buffer layer 4 is a 20 nm-thick layer for controlling the hole injection properties for example, and is made of TFB (poly(9,9-di-n-octylfluorene-alt-(1,4-phenylene-((4-sec-butylphenyl)imino)-1,4-phenylene)) for example, which is an amine-based compound.

Light-Emitting Layer 5

The light-emitting layer 5 is a 70 nm-thick layer of F8BT (poly(9,9-di-n-octylfluorene-alt-benzothiadiazole)), which is an organic polymer. The material of the light-emitting layer 5 is not limited to the above, and the light-emitting layer 5 may be made of any well-known organic material. Examples of such well-known organic material for the light-emitting layer 5 include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

Regulation Layer 6 and Electron Transport Layer 7

One main feature of the organic EL element 1 is that the regulation layer 6 and the electron transport layer 7 are sequentially layered in the direction from the surface of the light-emitting layer 5 to the cathode 8. The regulation layer 6 is disposed to be in contact with both the light-emitting layer 5 and the electron transport layer 7 and separates the layers 5 and 7 in the thickness direction.

The regulation layer is made of a compound of a first material and a second material that is different from the first material. The first material is either one or both of an alkali metal and an alkaline-earth metal, and the second material is halogen atoms. With these materials, the regulation layer 6 is a formed as an insulative layer composed of either one or both of an alkali metal halide and an alkaline-earth metal halide. Although the regulation layer 6 of the organic EL element 1 is made of sodium fluoride (NaF) as an example of an alkali metal fluoride, lithium fluoride (LiF) is also desirable. The regulation layer 6 is provided for avoiding the conventional problem that the interface between the light-emitting layer and the electron transport layer directly layered one another contains the molecules of both layers, and therefore great environmental changes occur in the interface during the driving of the element, and consequently the molecules constituting these layers unnecessarily react with each other and deteriorate the properties of the layers. The regulation layer 6 specifically is an insulative, functional separation layer for regulating the travelling of the molecules of the light-emitting layer 5 and of the electron transport layer 7. When formed thin enough (e.g. approximately 10 nm or thinner), the regulation layer 6 lets electrons pass through it by the tunnel effect while the element is driving.

For the above-described purpose, the fluorides contained in the regulation layer 6 need to have higher binding energy than molecules (organic materials described below) constituting the electron transport layer 7. The metal and the halogen atoms in alkali metal halides or alkaline-earth metal halides generally have considerably higher binding energy than common atoms contained in organic molecules, as shown in Tables 1 through 3 below. Therefore, any of the halides described above make the regulation layer 6 not reactive with the electron transport layer 7. Among halides, fluorides are particularly promising for higher chemical stability.

TABLE 1

Binding Energy between Alkali Metal and Halogen Atom

| (U/kJmol$^{-1}$) | F$^-$ | Cl$^-$ | Br$^-$ | I$^-$ |
|---|---|---|---|---|
| Li$^+$ | LiF 1040.67 | LiCl 858.11 | LiBr 817.93 | LiI 760.6 |
| Na$^+$ | NaF 923.74 | NaCl 785.53 | NaBr 750.54 | NaI 702.4 |
| K$^+$ | KF 823.75 | KCl 716.76 | KBr 688.78 | KI 647.9 |
| Rb$^+$ | RbF 792.41 | RbCl 692.06 | RbBr 666.29 | RbI 630.3 |
| Cs$^+$ | CsF 755.47 | CsCl 667.87 | CsBr 645.44 | CsI 611.1 |

TABLE 2

Binding Energy between Alkaline-earth metal and Halogen Atom

| (U/kJmol$^{-1}$) | O$^{2-}$ | F$^-$ | Cl$^-$ |
|---|---|---|---|
| Mg$^{2+}$ | MgO 3760 | MgF$_2$ 3216.5 | MgCl$_2$ 2747.21 |
| Ca$^{2+}$ | CaO 3371 | CaF$_2$ 2890.1 | CaCl$_2$ 2488.57 |
| Sr$^{2+}$ | SrO 3197 | SrF$_2$ 2751.45 | SrCl$_2$ 2386.3 |
| Ba$^{2+}$ | BaO 3019 | BaF$_2$ 2603.66 | BaCl$_2$ 2279.40 |

TABLE 3

Binding Energy of Typical Organic Materials

| Combination | Binding Energy (kJ/mol) | Combination | Binding Energy (kJ/mol) | Combination | Binding Energy (kJ/mol) |
|---|---|---|---|---|---|
| H—H | 435 | S—H | 339 | C=C | 611 |
| C—C | 347 | H—F | 565 | C≡C | 836 |
| N—N | 159 | H—Cl | 431 | C=O | 740 |
| O—O | 138 | H—Br | 368 | C=N | 615 |
| F—F | 159 | H—I | 297 | C≡N | 891 |
| Cl—Cl | 243 | C—N | 293 | O=O | 489 |
| Br—Br | 193 | C—O | 351 | N=N | 418 |
| I—I | 151 | C—F | 439 | N≡N | 945 |
| C—H | 414 | C—Cl | 330 | | |
| N—H | 389 | C—Br | 276 | | |
| O—H | 464 | C—I | 238 | | |
| P—H | 318 | C—S | 259 | | |

The electron transport layer 7 has a function of efficiently transporting electrons injected from the cathode 8 to the organic light-emitting layer 5. In the organic EL element 1, the electron transport layer 7 is an organic compound layer, and is composed of two different organic substances (i.e. a first organic substance as the electron transport material (host) and a second organic substance serving as n-type dopant).

Figure 2:
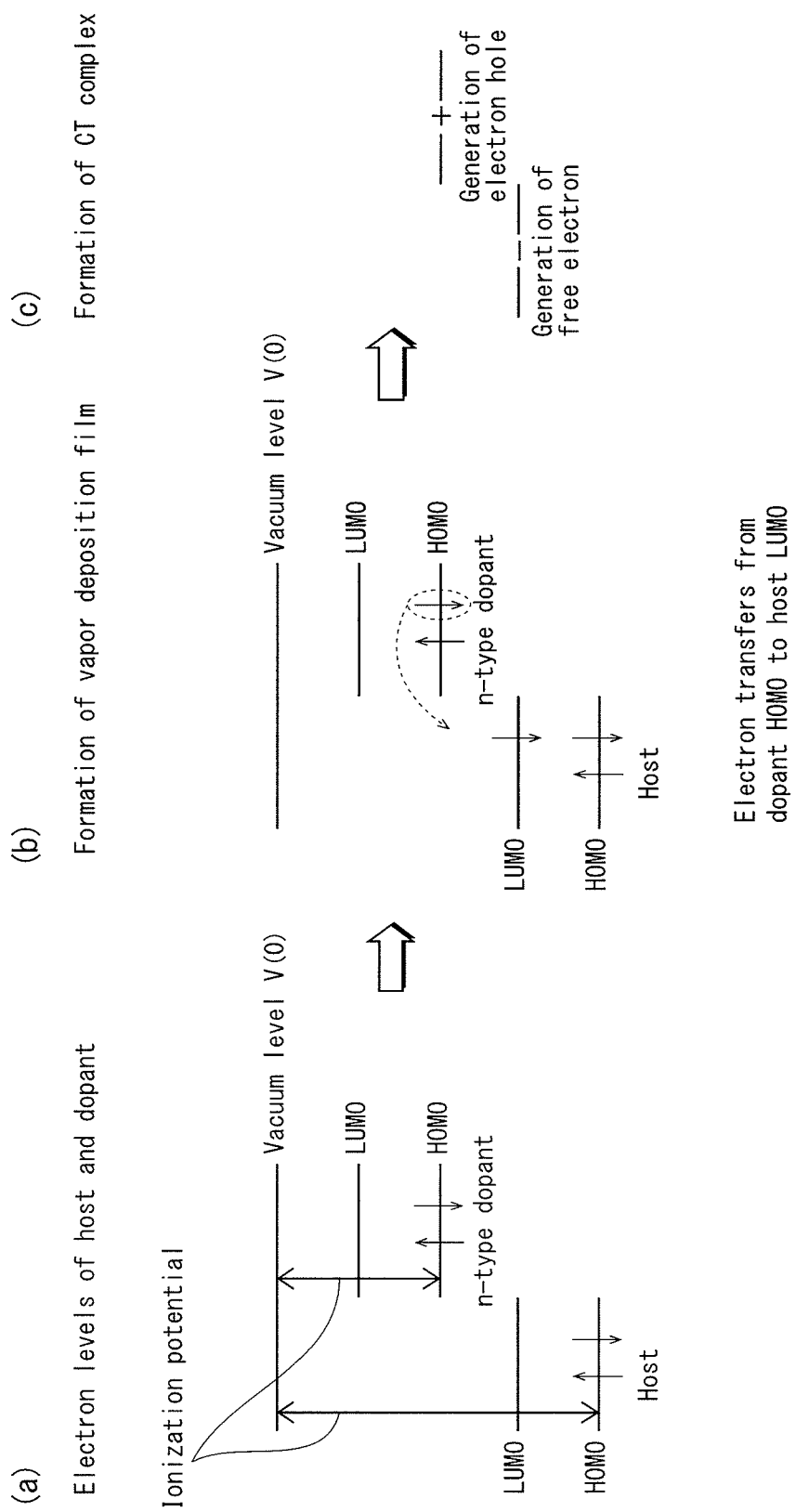
FIGS. 2(a)-(c) are diagrams showing an energy band of an electron transport layer forming a CT complex.

FIG. 2 is an energy band diagram showing energy bands of the host material and the n-type dopant material contained in the electron transport layer 7.

As shown in Part (a) of FIG. 2, each of the host material and the n-type dopant has the lowest unoccupied molecular orbital (LUMO) level and the highest occupied molecular orbital (HOMO) level at certain depths from the vacuum level V(0). Each material has a pair of electrons in the HOMO.

In the manufacturing process, a vapor deposition film is formed by sublimation of a material containing the host material and the n-type dopant according to a vacuum deposition method. At this step, if the HOMO level of the n-type dopant and the LUMO level of the host material are close enough, an electron transfers from the HOMO level of the n-type dopant to the LUMO level of the host material, as shown in Part (b) of FIG. 2. Consequently, the electron transport layer 7 is formed as a film of a charge transfer (CT) complex having a free electron and an electron hole as shown in Part (c) in FIG. 2. By using such a CT complex, the electron transport layer 7 can be made of an organic substance, but exhibits excellent electron transport properties.

Therefore, the electron transport properties can be enhanced by setting the difference between the HOMO level of the n-type dopant and the LUMO level of the electron transport material (i.e. host) as small as possible. Specifically, the difference is set smaller than a value within the range of 2 eV to 4 eV, preferably smaller than 1 eV.

According to such a criterion, examples of preferable electron transport material (i.e. host) include the materials shown in Table 4 below. Note that NTCDA and so on may be used instead.

TABLE 4

| Host Material | HOMO (eV) | LUMO (eV) |
|---|---|---|
| BCP | 6.7 | 3.2 |
| Bphen | 6.4 | 3.0 |
| Alq$_3$ | 5.7 | 2.9 |

Here, "BPhen" denotes Bathophenanthroline (4,7-Diphenyl-1,10-phenanthroline) represented by [Chemical formula 1] below.

[Chemical formula 1]

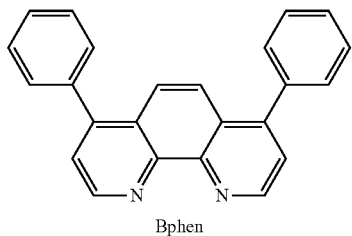

Bphen

Also, "Alq$_3$" denotes tris(8-hydroxyquinolinato)aluminium represented by [Chemical formula 2] below.

[Chemical formula 2]

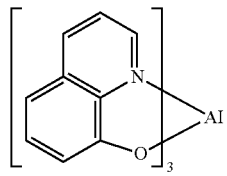

As the n-type dopant, CoCp$_2$(HOMO 4.0 eV) is preferred. Alternatively, TTN, PyB, Ru(terpy)$_2$, Cr(bby)$_3$, Cr(TMB)$_3$ or the like may be used. Note that Cr(TMB)$_3$ is referred to in J. Phys. Chem. B 2003, 107, 2933.

Depending on the combination of the host material and the n-type dopant or the film formation conditions, there is a possibility that the CT complex would not be formed. However, excellent electron transport properties can be realized by setting the difference between the HOMO level of the n-type dopant and the LUMO level of the electron transport material (i.e. host) as small as possible, as described above.

Cathode 8

The cathode 8 is made of a transparent electrode material having a thickness of a few micrometers, such as indium tin oxide (ITO) or indium zinc oxide (IZO). Alternatively, a 100 nm-thick metal layer (e.g. aluminum layer) may be used. In the case of a top-emission type organic EL element, it is preferable that a light-transmissive material is used.

As described above, in the organic EL element 1, the regulation layer is made of a metal halide having relatively high binding energy, and the electron transport layer 7 is interposed between the regulation layer 6 and the cathode 8. Therefore, the cathode 8 is not chemically reactive with the regulation layer 6 during the driving, and does not cause an unnecessary chemical reaction. Hence, the material of the cathode 8 is not limited to any particular material.

The passivation layer 9 is formed, for example, with silicon nitride (SiN), silicon oxynitride (SiON), etc., and controls the light-emitting layer 6 from deteriorating due to exposure to water, air, etc. In the case of a top-emission type organic EL element, it is preferable that the passivation layer 9 is also made of a light-transmissive material.

Effects and Advantages Produced by Organic EL Element 1

In the organic EL element 1 having the stated structure, the regulation layer 6 of NaF having excellent chemical stability against the light-emitting layer 5 and the electron transport layer 7 (i.e. the regulation layer 6 having higher binding energy than the constituent molecules of the light-emitting layer 5 and of the electron transport layer 7) is disposed between the light-emitting layer 5 and the electron transport layer 7. Therefore, the organic EL element 1 maintains the stable layer structure during the driving, and thus maintains the initial light-emitting properties for a long period.

Figure 3:
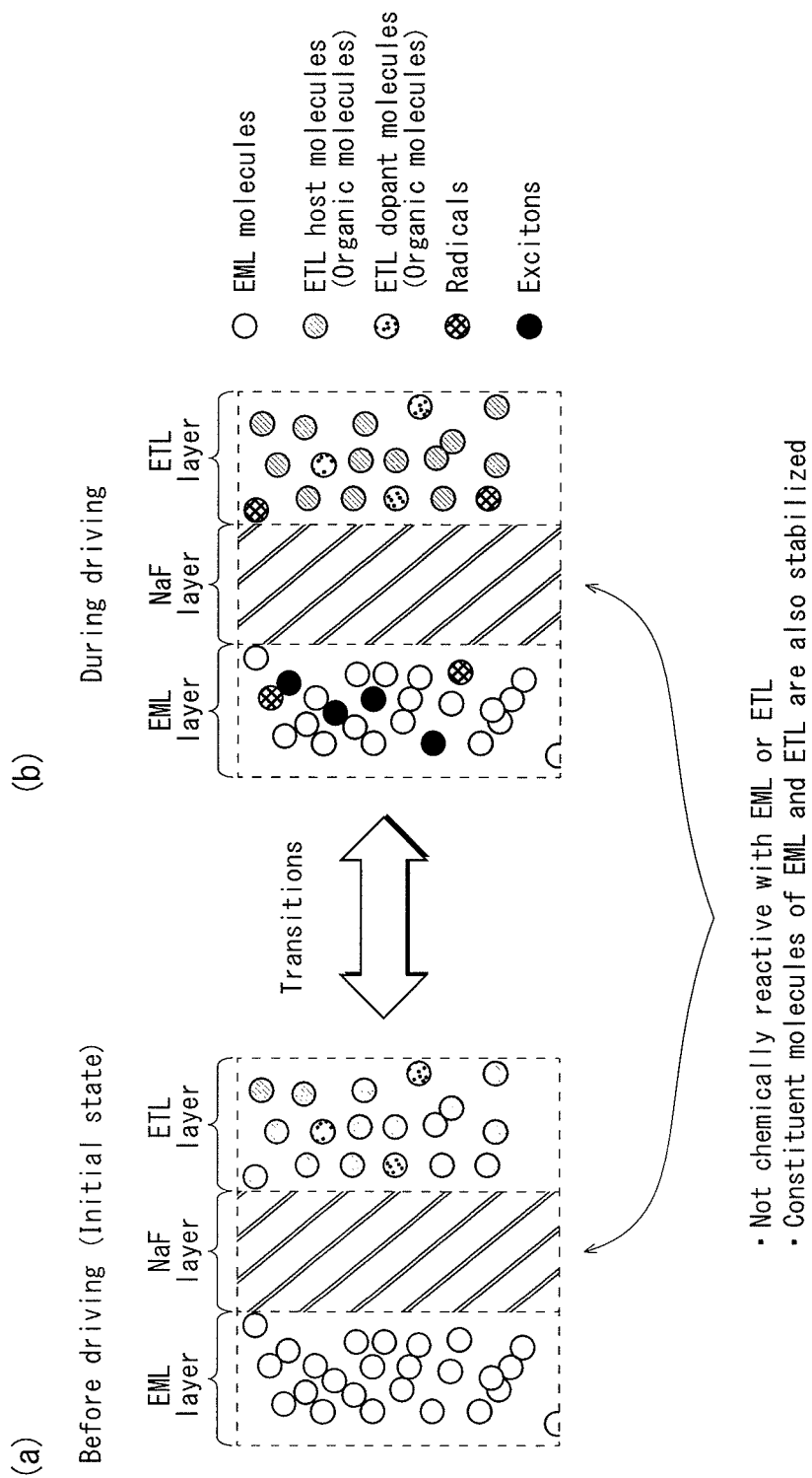
FIGS. 3(a) and (b) are schematic diagram diagrams showing an area around the interface between a light-emitting layer and an electron transport layer pertaining to Embodiment 1, before and after driving.

Part (a) of FIG. 3 is a schematic cross-sectional view showing the structure of the light-emitting layer 5 ("EML layer" in the drawing), the regulation layer 6 ("NaF layer" in the drawing), and the electron transport layer 7 ("ETL layer" in the drawing) of the organic EL element 1 before the driving (i.e. in the initial state).

As shown in the drawing, in the element 1, the light-emitting layer (EML layer) 5 and the electron transport layer (ETL layer) 7 are isolated by the regulation layer 5 (NaF) between them. The regulation layer 5 (NaF layer) separates the light-emitting layer 5 and the electron transport layer 7 from each other, both before the driving of the element (i.e. in the initial state) and during the driving of the element, and maintains the layers stable. As shown in Part (b) in FIG. 3, during the driving of the element, the constituent molecules of the light-emitting layer 5 and of the electron transport layer 7 are prevented from mixing with each other when electrons are injected from the negative electrode to the light-emitting layer (EML layer) 5. In addition, since the regulation layer is chemically stable, the alkali metal elements (Na) are not liberated. As the regulation layer 5 is formed thin enough, electrons are efficiently transported from the cathode 8 to the light-emitting layer 5 via the regulation layer 6 due to the tunnel effect for example during the driving of the element.

With the regulation layer 5 as described above, even when excitons are generated in the light-emitting layer 5 and radicals are generated in the light-emitting layer 5 and the electron transport layer 7, the constituent molecules of the light-emitting layer 5 and of the electron transport layer 7 are prevented from causing an unnecessary chemical reaction by being mixed with each other. Therefore, the stated structure prevents the deterioration of the light-emitting layer 5 and the electron transport layer 7.

In addition, the regulation layer 6 of the element 1 is made of a halide of an alkali metal or an alkaline-earth metal (e.g. NaF) having high binding energy, and hence the regulation layer 6 is chemically stable. Therefore, if the regulation layer 6 is exposed to air or water during the manufacturing process, the regulation layer 6 does not easily generate oxides or hydroxides, unlike conventional cathodes made of a simple substance of an alkaline-earth metal.

Consequently, the stated structure prevents the deterioration of the element 1, and maintains stable element properties of the element 1 for a long period.

In the following, description is provided of an example of a method for manufacturing the entire organic EL element 1.

Method of Manufacturing the Organic EL Element

First, a substrate 10 with TFT elements is prepared. Then, the substrate 10 is placed in the chamber of a sputtering film-forming apparatus, and a predetermined sputtering gas is introduced into the chamber to form the 50 nm-thick anode 2 composed of ITO by reactive sputtering.

Next, the hole injection layer 3 is formed also by reactive sputtering for example. Specifically, a metal material such as molybdenum or tungsten is used as sputtering source (i.e. target), and an argon gas serving as the sputtering gas and an oxygen gas serving as the reactive gas are introduced into the chamber. The hole injection layer 3 made of an oxide of molybdenum or tungsten is formed under these conditions.

Subsequently, as the material for forming the banks, photosensitive resin material or resist material containing fluorine material is prepared. The bank material is uniformly applied onto the hole injection layer 3. Then, the photoresist is applied on the bank material, and a mask provided with apertures having a predetermined shape (i.e. corresponding to the bank pattern to be formed) are placed on the photoresist. The photoresist is partially exposed to light from above the mask, and thus a resist pattern is formed. Subsequently, excess bank material and non-hardened photoresist is washed off with an aqueous or non-aqueous etchant (release agent). Thus, patterning of the bank material completes. Subsequently, the photo resist (resist residue) on the pattern bank material is washed off with pure water. Thus, the banks 11 are yielded.

Note that, in the process of forming the banks 11, the surfaces of the banks 11 may be treated with an alkaline solution, water, or an organic solvent, or by plasma treatment, in order to adjust the contact angles of the banks 11 with respect to the light-emitting layer material.

Following this, the buffer layer 4 is formed by ejecting drops of ink composition containing organic amine-containing molecular material onto a surface of the hole injection layer 3, which is exposed from between adjacent ones of banks 11, and removing the solvent of the ink composition by volatilization. The buffer layer 4 is thus formed.

Next, an ink composition containing an organic light-emitting material is dripped onto the surface of the buffer layer 4 by a similar method as in the forming of the hole injection layer 3, followed by removal of the solvent of the ink composition by volatilization. Thus, the light-emitting layer 5 is formed.

Here, it should be noted that the method applied for forming the buffer layer 4 and the light-emitting layer 5 is not limited to the above-described method. Other commonly-known methods besides the inkjet method and the gravure printing method may be applied for the ejection/application of ink. Such commonly-known methods include: the dispenser method; the nozzle coating method; the spin coating method; the intaglio printing method; the relief printing method and the like.

Subsequently, the regulation layer 6 is formed on the surface of the light-emitting layer 5 by a film formation method such as a vacuum deposition method using a vacuum film-forming apparatus. Specific conditions for the film formation are, for example, that the film formation speed is set to 0.1 angstroms/sec to 100 angstroms/sec, preferably 0.1 angstroms/sec to 50 angstroms/sec. The heating temperature is not limited insofar as materials do not decompose. The degree of vacuum is set to $10^{-2}$ Pa to $10^{-9}$ Pa for example, preferably to $10^{-3}$ Pa to $10^{-8}$ Pa.

Subsequently, a film is formed on the surface of the regulation layer 6 by a vacuum deposition method simultaneously using a first organic substance (i.e. host) and a second organic substance (i.e. n-type dopant) as the evaporation sources. Consequently, the electron transport layer 7 made only of organic materials is used. Note that the thickness of the layer can be adjusted by controlling the speed of deposition. Specific conditions for the film formation are, for example, that the film formation speed is 0.1 angstroms/sec to 100 angstroms/sec, preferably 0.1 angstroms/sec to 50 angstroms/sec. The heating temperature is not limited insofar as materials do not decompose. The degree of vacuum is set to $10^{-2}$ Pa to $10^{-9}$ Pa for example, preferably to $10^{-3}$ Pa to $10^{-8}$ Pa.

Subsequently, a film having a predetermined thickness is formed on the surface of the electron transport layer 7 by a vacuum deposition method using a transparent electrode material such as ITO or IZO or a metal material such as aluminum. Thus, the cathode 8 is formed.

Subsequently, the passivation layer 9 is formed on the surface of the cathode 8 by a vacuum deposition method using, for example, silicon nitride (SiN) or silicon oxynitride (SiON) as the evaporation source.

Through the manufacturing steps described above, the organic EL element 1 is completed.

About Organic EL Display Panel

Figure 5:
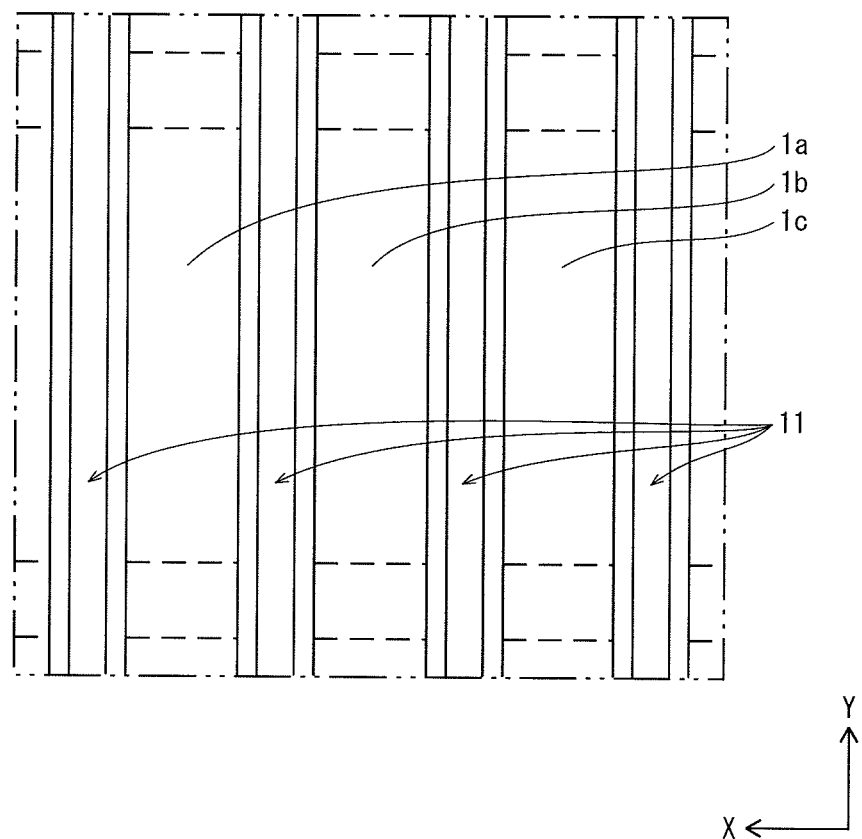
FIG. 5 is a front view illustrating a structure of an organic EL display panel using the organic EL element pertaining to Embodiment 1.

An organic EL display panel is manufactured by forming a plurality of the above-described organic EL elements 1 on the substrate 10. FIG. 5 is a front view illustrating an organic EL display panel having a plurality of organic EL elements 1.

In the areas partitioned by the line banks (banks 11), the organic EL elements 1a, 1b and 1c having luminescent colors corresponding to R, G and B colors are formed adjacent to each other. When organic EL elements 1 are adopted in the organic EL display panel, a plurality of element groups (pixels), each composed of the series of three elements 1 corresponding to R, G and B colors, are arranged on the substrate 10.

When the organic EL elements 1 are adopted in an organic display EL, the banks are not necessarily line banks, and may be pixel banks (lattice-shaped banks).

An organic EL light-emitting device such as an organic EL display panel is structured by forming the plurality of organic EL elements 1 serving as pixels on the substrate 10. Such an organic EL light-emitting device can be used as an image display device or an illumination device.

Experiments and Observations

Experiments were conducted to confirm performance of the present invention. Table 5 shows the structures of the samples used in the experiments. In Table 5, the layers between the EML and the cathode are denoted as "ETL1", "ETL2" "ETL3" and "ETL 4" in the order from the EML to the cathode, for the sake of convenience.

As Practical Sample 1, the element according to Embodiment was manufactured. In Table 5, the regulation layer is denoted as "ETL1", and the electron transport layer is denoted as "ETL2". The regulation layer is made of NaF, and the host material and the n-type dopant of the electron transport layer are respectively BCP and Ru(terpy)$_2$.

Table 6 shows the results of evaluation of the drive voltage and the structural stability of the samples driven for a predetermined period.

(Al) layered on the LiF layer and LiF liberated from the Li layer reacts with ETL1. Also in Comparative Samples 3 and 4, there is a possibility that the constituent molecules of ETL1 and of organic light-emitting layer are mixed at the interface therebetween and cause a chemical reaction.

TABLE 5

|  | EML | TL1 | ETL2 | ETL3 | ETL4 | Cathode | Light-emission Side |
|---|---|---|---|---|---|---|---|
| Practical Sample 1 | Organic Substance ≤4.5 eV | NaF 9.3 eV (Disposed as Functional Separation Layer) | Organic + Organic (BCP + Ru(terpy)$_2$) ≤4.5 eV | — | — | ITO | Cathode-side |
| Comparative Sample 1 | Organic Substance ≤4.5 eV | — | BCP:Ba ≤4.5 eV:31 eV | — | — | Al | Anode-side |
| Comparative Sample 2 | Organic Substance ≤4.5 eV | Alq$_3$ 4.5 eV | LiF 11 eV | Alq$_3$:Mg ≤4.5 eV:33 eV | Organic Substance:Mg ≤4.5 eV:33 eV | IZO | Cathode-side |
| Comparative Sample 3 | Organic Substance ≤4.5 eV | BAlq$_2$:BeBq$_2$ ≤4.5 eV | LiF 11 eV | — | — | Al 77 eV |  |
| Comparative Sample 4 | Organic Substance ≤4.5 eV | BAlq$_2$:BeBq$_2$ ≤4.5 eV:≤4.5 eV | BeBq$_2$:LiF ≤4.5 eV:11 eV | — | — | Al 77 eV |  |

TABLE 6

|  | Evaluation Results |
|---|---|
| Practical Sample 1 | A stable structure is formed at least between EML and the cathode. |
| Comparative Sample 1 | There is a possibility of reaction between EML and ETL 2. |
| Comparative Sample 2 | There is a possibility of reaction between EML and ETL1, ETL2 and ETL3, ETL3 and ETL4, and ELT4 and the cathode. |
| Comparative Sample 3 | There is a possibility of reaction between EML and ETL1, and ETL2 and the cathode. |
| Comparative Sample 4 | There is a possibility of reaction between EML and ETL1, and ETL2 and the cathode. |

As indicated by the evaluation results shown in FIG. 6, it was observed that Comparative Sample 1 has a possibility of reaction between the light-emitting layer and the ETL2. This can be because Ba is used in the electron transport layer (ETL2) and the cathode made of Al is formed directly on the electron transport layer. It is considered that, when the element was driven, Ba liberated by the ionization of Al was combined with oxygen and formed BaO, or reacted with the constituent molecules of the organic light emitting layer, and thereby deteriorated the light-emitting properties.

With regard to Comparative Sample 2, it was observed that ETL1 made of Alq$_3$ could react with the organic light-emitting layer, the LIF layer of the ETL2 could react with "Alq$_3$:Mg" of ETL3, ETL3 could react with ETL4 made of "organic substance:Mg", and ETL4 could react with the cathode made of IZO. It is considered that unnecessary chemical reactions at each interface deteriorated the constituent molecules of each layer and increased the drive voltage, and thereby changed the structure of the element. Note that, in Comparative Sample 2, the LiF layer is used in ETL2, and it is highly possible that the LiF layer reacts with the ETL3 when the element is driven and Li is liberated from the LiF layer, and further reacts with ETL1. In this point, Comparative Sample 2 is greatly different from Practical Sample 2 in which the regulation layer which is chemically stable is provided.

As with Comparative Sample 2, Comparative Samples 3 and 4 were not chemically stable because there is a possibility that the LiF layer chemically reacts with the cathode Compared with these Comparative Samples 1 through 4, Practical Sample 1 maintains excellent chemical stability at each interface between the light-emitting layer, ETL1 (the regulation layer), ETL2 (the electron transport layer) and the cathode (ITO), and achieves stable light-emitting properties. Also, since ETL2 (the electron transport layer) is made of a CT complex, ETL2 made of organic material achieves high conductivity that is comparable to alkali metal, and realizes low-voltage driving, which is an important device characteristic. As described above, Practical Sample 1 is characterized by its capability of maintaining the stable structure both before and after the driving of the element.

Although NaF is used in ETL1 of Practical Sample 1 shown in Table 5, it was observed that the same performance can be achieved by using LiF instead of NaF.

(Additional Matters)

In the element according to the present invention, a hole transport layer may be provided between the hole injection layer and the light-emitting layer. The hole transport layer has the function of transporting holes injected from the hole injection layer to the light-emitting layer. An organic material with hole transporting properties is used as the hole transport layer. The organic material for the hole transport layer is an organic substance having the property of conducting holes via an intermolecular charge-transfer reaction. This organic substance is also known as a p-type organic semiconductor.

The material for the hole transport layer may be either a high molecular material or a low molecular material, and the hole transport layer may be formed by wet printing, for example. When forming the light-emitting layer, which is the uppermost layer, it is desirable for the material for the hole transport layer to include a cross-linking agent so as not to mix with the material for the light-emitting layer. Examples of the material for the hole transport layer are a copolymer that includes a fluorene region and a triarylamine region, and a triarylamine derivative with a low molecular weight. An example of a cross-linking agent is dipentaerythritol hexaacrylate. In this case, it is desirable that the cross-linking agent be formed from poly(3, 4-ethylenedioxythiophene) doped with polystyrene sulfonic acid (PEDOT: PSS) or a derivative thereof (a copolymer or the like).

According to the present invention, an electron injection layer may be formed between the light-emitting layer and the electron transport layer by using a well-known material.

The anode according to the present invention is not necessarily formed as a single layer. For example, an ITO layer may be formed on an Ag layer.

Conventionally, a structure in which LiF or the like is interposed between the cathode and the organic light-emitting layer is well-known. This is for causing the cathode to react with F by placing LiF next to the cathode, and using Li as the electron transportation material ($Li \rightarrow Li^+ + e^-$). According to the present invention, the regulation layer is prevented from chemically reacting with the organic light-emitting layer, the electron transport layer, or the cathode. This is definitely different from conventional technologies.

The "electron transport layer" according to the present invention may be provided as "electron injection layer" or "electron injection transport layer".

INDUSTRIAL APPLICABILITY

The organic EL element pertaining to the present invention is to be used as display elements for mobile phone displays and TVs, and as a light source for various applications. Regardless of the specific use thereof, the organic EL element of the present invention is applicable as an organic EL element having a wide range of luminous intensity from low luminous intensity to high luminous intensity for the use as a light source or the like, and which can be driven at a low voltage. The organic EL element of the present invention, for having such a high level of performance, may be used in a wide range of applications, including those for household use, those for use in public facilities, and those for professional use. More specifically, such applications include: various display devices; TV apparatuses; displays for portable electronic devices; illumination light sources, and etc.

LIST OF REFERENCE SIGNS 1, 1a, 1b, 1c: organic EL element
2: anode
3: hole injection layer (HIL)
4: buffer layer
5: light-emitting layer (EML)
6: regulation layer (functional separation layer)
7: electron transport layer (ETL)
8: cathode
9: passivation layer
10: substrate (TFT substrate)
11: banks
DC: direct current power supply

The invention claimed is:

1. An organic light-emitting element comprising:
an anode;
a cathode disposed opposite the anode;
an organic light-emitting layer disposed between the anode and the cathode, and containing an organic light-emitting material;
an electron transport layer disposed between the organic light-emitting layer and the cathode, and transporting electrons injected from the cathode to the organic light-emitting layer; and
a regulation layer disposed between and in contact with the organic light-emitting layer and the electron transport layer, and regulating transfer of constituent molecules of the organic light-emitting layer and of the electron transport layer while allowing transfer of electrons therebetween, wherein
the electron transport layer is made of an organic substance,
the regulation layer is not chemically reactive with the electron transport layer or the organic light-emitting layer,
the electron transport layer contains: a first organic substance having an electron transport property; and a second organic substance that is of n-type and is different from the first organic substance, and
a difference in energy level between a highest occupied molecular orbital of the first organic substance and a lowest unoccupied molecular orbital of the second organic substance is no more than 1.6 eV.

2. The organic light-emitting element of claim 1, wherein the regulation layer is made of a chemical compound including: a first material; and a second material that is different from the first material, and
lattice energy of the chemical compound is greater than binding energy between any atoms of the constituent molecules of the organic light-emitting layer and of the electron transport layer.

3. The organic light-emitting element of claim 1, wherein the regulation layer is an insulative layer.

4. The organic light-emitting element of claim 1, wherein the regulation layer has a thickness no less than 1 nm and no more than 10 nm.

5. The organic light-emitting element of claim 1, wherein the regulation layer is made of either one or both of an alkali metal fluoride and an alkaline-earth metal fluoride.

6. The organic light-emitting element of claim 5, wherein the alkali metal fluoride is NaF.

7. The organic light-emitting element of claim 5, wherein the alkaline-earth metal fluoride is $MgF_2$.

8. The organic light-emitting element of claim 1, wherein the electron transport layer contains:
BPhen, $Alq_3$ or BCP, as the first organic substance; and
$Ru(terpy)_2$, $Cr(bpy)_3$, $Cr(TMB)_3$, PyB or $CoCp_2$, as the second organic substance.

9. An organic light-emitting element comprising:
an anode;
a cathode disposed opposite the anode;
an organic layer disposed between the anode and the cathode, and containing an organic substance;
a chemical compound layer disposed between the organic layer and the cathode; and
a regulation layer disposed between and in contact with the organic layer and the chemical compound layer, and regulating transfer of constituent molecules of the organic layer and of the chemical compound layer while allowing transfer of electrons therebetween, wherein
the chemical compound layer is made of an organic substance,
the regulation layer is not chemically reactive with the organic layer or the chemical compound layer,
the chemical compound layer contains: a first organic substance; and a second organic substance that is different from the first organic substance, and
a difference in energy level between a highest occupied molecular orbital of the first organic substance and a lowest unoccupied molecular orbital of the second organic substance is no more than 1.6 eV.

10. The organic light-emitting element of claim 9, wherein
the regulation layer is made of a chemical compound including: a first material; and a second material that is different from the first material, and
lattice energy of the chemical compound is greater than binding energy between any atoms of the constituent molecules of the organic layer and of the chemical compound layer.

11. The organic light-emitting element of claim 9, wherein the regulation layer is an insulative layer.

12. The organic light-emitting element of claim 9, wherein
the regulation layer has a thickness no less than 1 nm and no more than 10 nm.

13. The organic light-emitting element of claim 9, wherein
the regulation layer is made of either one or both of an alkali metal fluoride and an alkaline-earth metal fluoride.

14. The organic light-emitting element of claim 13, wherein
the alkali metal fluoride is NaF.

15. The organic light-emitting element of claim 13, wherein
the alkaline-earth metal fluoride is $MgF_2$.

16. The organic light-emitting element of claim 9, wherein
the chemical compound layer contains:
BPhen, $Alq_3$ or BCP, as the first organic substance; and
$Ru(terpy)_2$, $Cr(bpy)_3$, $Cr(TMB)_3$, PyB or $CoCp_2$, as the second organic substance.

17. An organic light-emitting element, comprising:
an anode;
a cathode disposed opposite the anode;
an organic light-emitting layer disposed between the anode and the cathode, and containing an organic substance;
an insulative layer disposed in contact with the organic light-emitting layer; and
an electron transport layer disposed in contact with the insulative layer and containing: a first organic substance; and a second organic substance that is different from the first organic substance, wherein
a difference in energy level between a highest occupied molecular orbital of the first organic substance and a lowest unoccupied molecular orbital of the second organic substance is no more than 1.6 eV,
the insulative layer contains a chemical compound including: a first material; and a second material that is different from the first material, and
lattice energy of the chemical compound is greater than binding energy between any constituent atoms of the organic substance contained in the organic light-emitting layer, and is greater than binding energy between any constituent atoms of the first organic substance and the second organic substance contained in the electron transport layer.

18. An organic light-emitting element, comprising:
an anode;
a cathode disposed opposite the anode;
an organic layer disposed between the anode and the cathode and containing an organic substance;
an insulative layer disposed in contact with the organic layer; and
a chemical compound layer disposed in contact with the insulative layer and containing: a first organic substance; and a second organic substance that is different from the first organic substance, wherein
a difference in energy level between a highest occupied molecular orbital of the first organic substance and a lowest unoccupied molecular orbital of the second organic substance is no more than 1.6 eV,
the insulative layer contains a chemical compound including: a first material; and a second material that is different from the first material, and
lattice energy of the chemical compound is greater than binding energy between any constituent atoms of the organic substance contained in the organic layer, and is greater than binding energy between any constituent atoms of the first organic substance and the second organic substance contained in the chemical compound layer.

19. An organic light-emitting device including the organic light-emitting element according to claim 1.

20. An organic light-emitting element comprising:
an anode;
a cathode disposed opposite the anode;
an organic light-emitting layer disposed between the anode and the cathode, and containing an organic light-emitting material;
an electron transport layer disposed between the organic light-emitting layer and the cathode, and transporting electrons injected from the cathode to the organic light-emitting layer; and
a regulation layer disposed between and in contact with the organic light-emitting layer and the electron transport layer, and regulating transfer of constituent molecules of the organic light-emitting layer and of the electron transport layer while allowing transfer of electrons therebetween, wherein
the electron transport layer is made of an organic substance,
the regulation layer is not chemically reactive with the electron transport layer or the organic light-emitting layer,
the electron transport layer contains: a first organic substance having an electron transport property; and a second organic substance that is of n-type and is different from the first organic substance, and
the electron transport layer contains a charge transfer complex of the first organic substance and the second organic substance.

21. The organic light-emitting element of claim 20, wherein
the regulation layer is made of a chemical compound including: a first material; and a second material that is different from the first material, and
lattice energy of the chemical compound is greater than binding energy between any atoms of the constituent molecules of the organic light-emitting layer and of the electron transport layer.

22. The organic light-emitting element of claim 20, wherein
the regulation layer is an insulative layer.

23. The organic light-emitting element of claim 20, wherein
the regulation layer has a thickness no less than 1 nm and no more than 10 nm.

24. The organic light-emitting element of claim 20, wherein
the regulation layer is made of either one or both of an alkali metal fluoride and an alkaline-earth metal fluoride.

25. The organic light-emitting element of claim 24, wherein
the alkali metal fluoride is NaF.

26. The organic light-emitting element of claim 24, wherein
the alkaline-earth metal fluoride is $MgF_2$.

27. The organic light-emitting element of claim 20, wherein
the electron transport layer contains:
BPhen, $Alq_3$ or BCP, as the first organic substance; and
$Ru(terpy)_2$, $Cr(bpy)_3$, $Cr(TMB)_3$, PyB or $CoCp_2$, as the second organic substance.

28. An organic light-emitting device including the organic light-emitting element according to claim 20.

29. An organic light-emitting element comprising:
an anode;
a cathode disposed opposite the anode;
an organic layer disposed between the anode and the cathode, and containing an organic substance;
a chemical compound layer disposed between the organic layer and the cathode; and
a regulation layer disposed between and in contact with the organic layer and the chemical compound layer, and regulating transfer of constituent molecules of the organic layer and of the chemical compound layer while allowing transfer of electrons therebetween, wherein
the chemical compound layer is made of an organic substance,
the regulation layer is not chemically reactive with the organic layer or the chemical compound layer,
the chemical compound layer contains: a first organic substance; and a second organic substance that is different from the first organic substance, and
the chemical compound layer contains a charge-transfer complex of the first organic substance and the second organic substance.

30. The organic light-emitting element of claim 29, wherein
the regulation layer is made of a chemical compound including: a first material; and a second material that is different from the first material, and
lattice energy of the chemical compound is greater than binding energy between any atoms of the constituent molecules of the organic layer and of the chemical compound layer.

31. The organic light-emitting element of claim 29, wherein
the regulation layer is an insulative layer.

32. The organic light-emitting element of claim 29, wherein
the regulation layer has a thickness no less than 1 nm and no more than 10 nm.

33. The organic light-emitting element of claim 29, wherein
the regulation layer is made of either one or both of an alkali metal fluoride and an alkaline-earth metal fluoride.

34. The organic light-emitting element of claim 33, wherein
the alkali metal fluoride is NaF.

35. The organic light-emitting element of claim 33, wherein
the alkaline-earth metal fluoride is $MgF_2$.

36. The organic light-emitting element of claim 29, wherein
the chemical compound layer contains:
BPhen, $Alq_3$ or BCP, as the first organic substance; and
$Ru(terpy)_2$, $Cr(bpy)_3$, $Cr(TMB)_3$, PyB or $CoCp_2$, as the second organic substance.

37. An organic light-emitting element, comprising:
an anode;
a cathode disposed opposite the anode;
an organic light-emitting layer disposed between the anode and the cathode, and containing an organic substance;
an insulative layer disposed in contact with the organic light-emitting layer; and
an electron transport layer disposed in contact with the insulative layer and containing: a first organic substance; and a second organic substance that is different from the first organic substance, wherein
the electron transport layer contains a charge transfer complex of the first organic substance and the second organic substance,
the insulative layer contains a chemical compound including: a first material; and a second material that is different from the first material, and
lattice energy of the chemical compound is greater than binding energy between any constituent atoms of the organic substance contained in the organic light-emitting layer, and is greater than binding energy between any constituent atoms of the first organic substance and the second organic substance contained in the electron transport layer.

38. An organic light-emitting element, comprising:
an anode;
a cathode disposed opposite the anode;
an organic layer disposed between the anode and the cathode and containing an organic substance;
an insulative layer disposed in contact with the organic layer; and
a chemical compound layer disposed in contact with the insulative layer and containing: a first organic substance; and a second organic substance that is different from the first organic substance, wherein
the chemical compound layer contains a charge-transfer complex of the first organic substance and the second organic substance,
the insulative layer contains a chemical compound including: a first material; and a second material that is different from the first material, and
lattice energy of the chemical compound is greater than binding energy between any constituent atoms of the organic substance contained in the organic layer, and is greater than binding energy between any constituent atoms of the first organic substance and the second organic substance contained in the chemical compound layer.

* * * * *